US012671322B2

(12) United States Patent
Kotake et al.

(10) Patent No.: US 12,671,322 B2
(45) Date of Patent: Jun. 30, 2026

(54) AIR CONDITIONING SYSTEM

(71) Applicant: Mitsubishi Electric Corporation, Tokyo (JP)

(72) Inventors: Hiroaki Kotake, Tokyo (JP); Kazuki Nata, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 43 days.

(21) Appl. No.: 18/867,316

(22) PCT Filed: Jun. 6, 2022

(86) PCT No.: PCT/JP2022/022786
§ 371 (c)(1),
(2) Date: Nov. 19, 2024

(87) PCT Pub. No.: WO2023/238190
PCT Pub. Date: Dec. 14, 2023

(65) Prior Publication Data
US 2025/0309757 A1 Oct. 2, 2025

(51) Int. Cl.
H02M 1/44 (2007.01)
F24F 11/88 (2018.01)
(Continued)

(52) U.S. Cl.
CPC ............... H02M 1/44 (2013.01); F24F 11/88 (2018.01); H05K 5/04 (2013.01); H05K 9/0007 (2013.01)

(58) Field of Classification Search
CPC ..... H04W 4/023; H04W 4/029; H04W 64/00; H04W 4/33; H04W 4/80; H04W 64/006;
(Continued)

(56) References Cited

U.S. PATENT DOCUMENTS 6,301,914 B1 * 10/2001 Oliva ...................... F24F 1/027
62/262
8,258,649 B2 * 9/2012 Zyren ...................... H04B 3/56
307/3
(Continued)

FOREIGN PATENT DOCUMENTS

JP 7-243691 A 9/1995
JP 2003-169495 A 6/2003
(Continued)

OTHER PUBLICATIONS

International Search Report mailed Aug. 9, 2022 in the corresponding International Patent Application No. PCT/JP2022/022786 (and English translation).

*Primary Examiner* — Eva Y Puente
(74) *Attorney, Agent, or Firm* — Posz Law Group, PLC

(57) ABSTRACT
A direct current power supply generates a power supply voltage being a direct current voltage. A communication circuit is drivable by the power supply voltage generated by the direct current power supply. The communication circuit communicates with another communication circuit with a communication method using a radio frequency signal through a communication line. The communication line is a core wire included in a cable including a shield. The shield is connected to a ground of the communication circuit at two ends of the cable.

10 Claims, 8 Drawing Sheets

(51) Int. Cl.
    *H05K 5/04*         (2006.01)
    *H05K 9/00*         (2006.01)

(58) Field of Classification Search
    CPC ... H04W 84/18; H04W 16/28; H04W 72/046;
               H04L 67/12; H04L 67/125; H04L
            12/2803; H04L 12/282; H04L 5/0053;
            H04L 12/2816; H04L 67/10; H04L
           2012/285; H04B 17/318; H04B 1/40;
         H04B 7/0617; H04B 7/04; H04B 7/0621;
        H04B 7/15571; H04B 5/79; H04B 1/38;
                            H04B 1/59
    See application file for complete search history.

(56)                     References Cited

U.S. PATENT DOCUMENTS

| | | | |
|---|---|---|---|
| 11,063,466 B2 * | 7/2021 | Sun | F24F 11/46 |
| 2020/0412125 A1 * | 12/2020 | Mosebrook | H02J 13/1333 |
| 2021/0006290 A1 | 1/2021 | Doumae et al. | |
| 2021/0222898 A1 * | 7/2021 | Verish | F24F 8/26 |
| 2024/0007372 A1 | 1/2024 | Kodera et al. | |

FOREIGN PATENT DOCUMENTS

| | | |
|---|---|---|
| JP | 2004-347261 A | 12/2004 |
| JP | 2005-303280 A | 10/2005 |
| JP | 2011-117658 A | 6/2011 |
| JP | 2019-041384 A | 3/2019 |
| JP | 2019-152426 A | 9/2019 |
| JP | 6702471 B2 | 6/2020 |
| JP | 7041382 B1 | 3/2022 |
| WO | 2019/168168 A1 | 9/2019 |

* cited by examiner

FIG. 8

AIR CONDITIONING SYSTEM

CROSS REFERENCE TO RELATED APPLICATION

This application is a U.S. national stage application of PCT/JP2022/022786 filed on Jun. 6, 2022 the contents of which are incorporated herein by reference.

TECHNICAL FIELD

The present disclosure relates to an air conditioning system.

BACKGROUND

Recent sophisticated control and advanced analysis techniques using sensing data have increased communication traffic in air conditioning systems. To respond to such increased communication traffic, the method of communication between air conditioners may be changed to a method capable of high-speed communication. For example, Patent Literature 1 describes an air conditioning system in which an indoor unit and an outdoor unit communicate with a communication method using orthogonal frequency division multiplexing (OFDM).

Two air conditioning systems having communication lines extending parallel to each other may have crosstalk resulting from capacitive coupling caused by stray capacitance between the communication lines or from inductive coupling caused by mutual inductance. Crosstalk may cause information transmitted from one air conditioner to be unintentionally received by another air conditioner that is not an intended destination. Such crosstalk is more likely to occur in signals with higher frequencies used for communication.

PATENT LITERATURE

Patent Literature 1: Unexamined Japanese Patent Application Publication No. 2019-152426

However, Patent Literature 1 does not describe a technique for reducing such crosstalk. In other words, in the air conditioning system described in Patent Literature 1, crosstalk may occur in communication between air conditioners using radio frequency (RF) signals. Techniques are thus awaited for reducing crosstalk in communication between air conditioners using RF signals.

SUMMARY

In response to the above issue, an objective of the present disclosure is to provide an air conditioning system that reduces crosstalk in communication between air conditioners using RF signals.

To achieve the above objective, an air conditioning system according to an aspect of the present disclosure includes a plurality of air conditioners, and a communication line interconnecting the plurality of air conditioners. Each of the plurality of air conditioners includes a direct current power supply to generate a power supply voltage being a direct current voltage, and a communication circuit drivable by the power supply voltage generated by the direct current power supply. The communication circuit communicates with another communication circuit with a communication method using a radio frequency signal through the communication line. The communication line is a core wire included in a cable including a shield. The shield is connected to a ground of the communication circuit at two ends of the cable.

In the structure according to the above aspect of the present disclosure, the communication line interconnecting the plurality of air conditioners is the core wire included in the cable including the shield. The shield is connected to the ground of the communication circuit at the two ends of the cable. Thus, the air conditioning system according to the above aspect of the present disclosure can reduce crosstalk in communication between the air conditioners using RF signals.

BRIEF DESCRIPTION OF DRAWINGS

FIG. 8 is a schematic diagram of a DC power supply in Embodiment 4.

DETAILED DESCRIPTION

Figure 1:
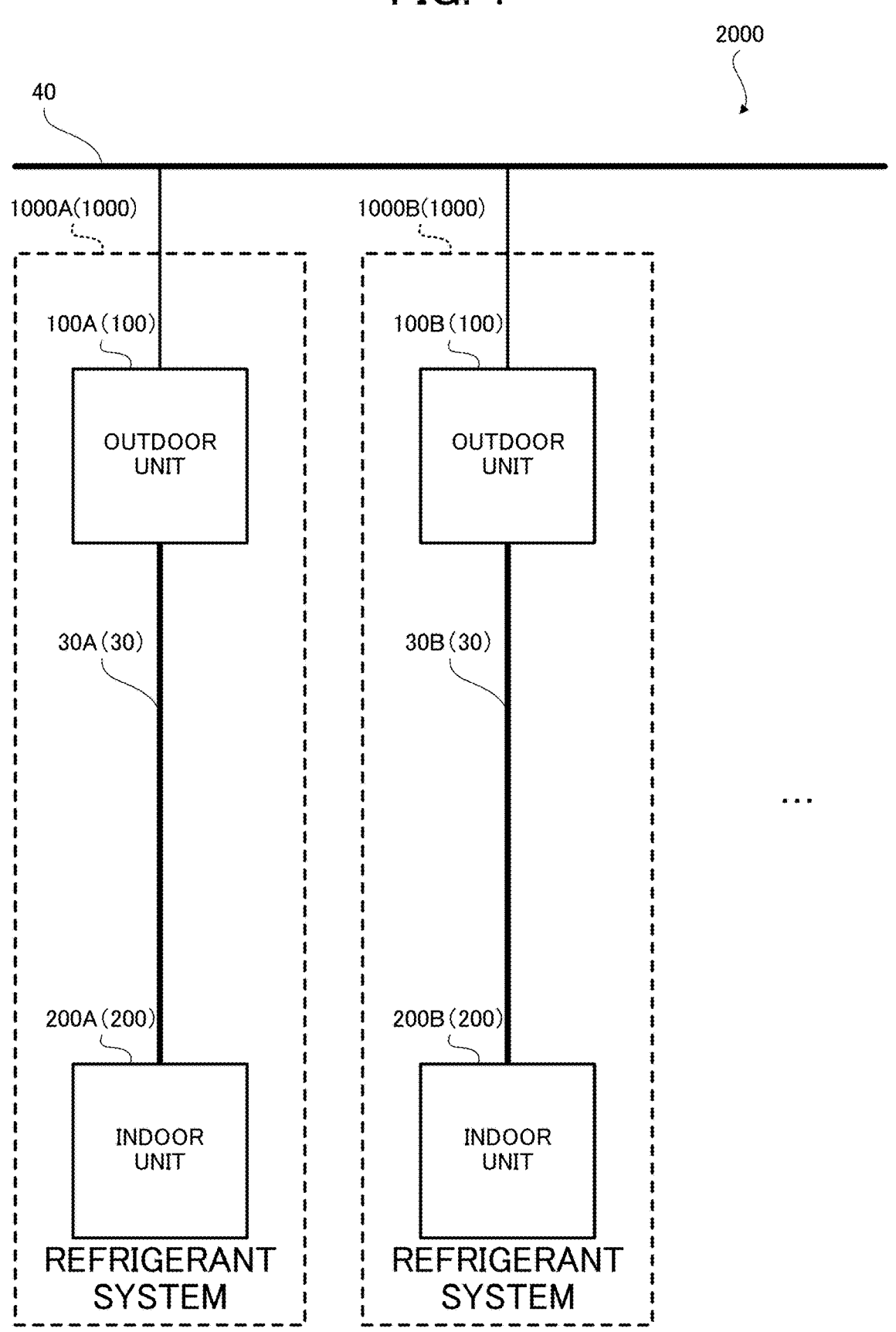
FIG. 1 is a block diagram of an air conditioning system according to Embodiment 1.

Embodiments of the present disclosure are described in detail below with reference to the drawings. In the drawings, like reference signs denote like or corresponding components.

Embodiment 1

FIG. 1 is a block diagram of an air conditioning system 2000 according to Embodiment 1. The air conditioning system 2000 conditions air inside, for example, a building, a condominium building, an apartment building, or a factory. The air conditioning system 2000 includes multiple refrigerant systems 1000 and a transmission path 40 interconnecting the multiple refrigerant systems 1000. The air conditioning system 2000 may include any number of refrigerant systems 1000 as appropriate. In the present embodiment, the air conditioning system 2000 includes at least two refrigerant systems 1000, or specifically, a refrigerant system 1000A and a refrigerant system 1000B. The refrigerant system 1000A and the refrigerant system 1000B are collectively referred to as the refrigerant systems 1000 as appropriate.

The transmission path 40 allows high-speed baseband communication and is compatible with, for example, Ethernet (registered trademark). The transmission path 40 interconnects outdoor units 100 included in the multiple refrigerant systems 1000. The communication speed of the baseband communication using the transmission path 40 is, for example, 100 Mbps. The transmission path 40 forms a local area network (LAN).

Each refrigerant system 1000 is a unit for conditioning indoor air. The refrigerant system 1000 includes an outdoor unit 100, at least one indoor unit 200, and a transmission path 30 interconnecting the outdoor unit 100 and the indoor unit 200. The refrigerant system 1000 may include any number of indoor units 200 as appropriate. In the present embodiment, the refrigerant system 1000A includes an outdoor unit 100A, an indoor unit 200A, and a transmission path 30A. The refrigerant system 1000B includes an outdoor unit 100B, an indoor unit 200B, and a transmission path 30B.

Air conditioners included in the same refrigerant system 1000 are interconnected with a refrigerant pipe (not illustrated) to provide and receive a refrigerant to and from one another. The air conditioners included in the same refrigerant system 1000 are also interconnected with the transmission path 30 to communicate with one another. The outdoor unit 100A and the outdoor unit 100B are collectively referred to as the outdoor units 100 as appropriate. The indoor unit 200A and the indoor unit 200B are collectively referred to as the indoor units 200 as appropriate. The outdoor units 100 and the indoor units 200 are collectively referred to as the air conditioners as appropriate. The transmission path 30A and the transmission path 30B are collectively referred to as the transmission paths 30 as appropriate.

Each outdoor unit 100 is equipment for conditioning indoor air installed outdoors. Conditioning indoor air refers to adjusting, for example, the temperature, humidity, and cleanliness of indoor air. The outdoor unit 100 communicates with the indoor unit 200 through the transmission path 30. The outdoor unit 100 circulates a refrigerant between the outdoor unit 100 and the indoor unit 200 through a refrigerant pipe (not illustrated). The outdoor unit 100 is an example of an air conditioner.

Figure 2:
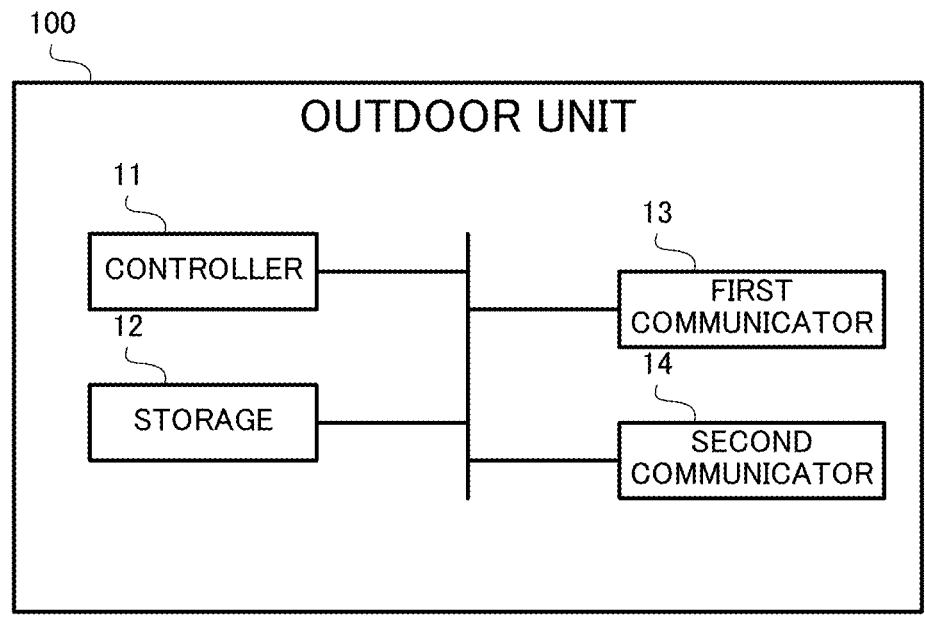
FIG. 2 is a block diagram of an outdoor unit in Embodiment 1.

The structure of the outdoor unit 100 is described with reference to FIG. 2. FIG. 2 mainly illustrates components of the outdoor unit 100 used for communication. As illustrated in FIG. 2, the outdoor unit 100 includes a controller 11, a storage 12, a first communicator 13, and a second communicator 14.

The controller 11 includes a central processing unit (CPU), a read-only memory (ROM), a random-access memory (RAM), and a real-time clock (RCT). The CPU is also be referred to as a central processing device, a central arithmetic device, a processor, a microprocessor, a microcomputer, or a digital signal processor (DSP), and functions as a central arithmetic processing unit that performs processing and arithmetic operations for controlling the outdoor unit 100. In the controller 11, the CPU reads programs and data stored in the ROM and centrally controls the outdoor unit 100 using the RAM as a work area. The RTC is, for example, an integrated circuit with a clocking function. The CPU can determine the current date and time based on time information read from the RTC.

The storage 12 includes a nonvolatile semiconductor memory such as a flash memory, an erasable programmable ROM (EPROM), or an electrically erasable programmable ROM (EEPROM) to serve as an auxiliary storage. The storage 12 stores programs and data used by the controller 11 to perform various processes. The storage 12 also stores data generated or acquired by the controller 11 through various processes.

The first communicator 13 communicates with other outdoor units 100 through the transmission path 40 as controlled by the controller 11. The first communicator 13 includes a communication interface for connecting to the transmission path 40. The first communicator 13 includes, for example, a LAN card compatible with Ethernet (registered trademark).

The second communicator 14 communicates with the indoor unit 200 through the transmission path 30 as controlled by the controller 11. The second communicator 14 communicates with the indoor unit 200 through the transmission path 30 with a communication method using radio frequency (RF) signals. For example, the second communicator 14 communicates with the indoor unit 200 with a multicarrier transmission method. With a multicarrier transmission method, signals are superimposed on subcarriers having multiple frequency spectra that do not interfere with each other. A typical multicarrier transmission method is orthogonal frequency division multiplexing (OFDM). The RF signal may have a frequency greater than or equal to 1 MHz. In the present embodiment, the RF signal has a frequency of several to several tens of megahertz. The second communicator 14 includes a communication interface for connecting to the transmission path 30.

The indoor unit 200 is equipment for conditioning indoor air installed indoors. The indoor unit 200 supplies conditioning air indoors. Conditioning air conditions indoor air and is typically heating air or cooling air. Heating air warms an indoor space and has a temperature higher than the temperature of indoor air. Cooling air cools the indoor space and has a temperature lower than the temperature of indoor air.

The indoor unit 200 includes a controller (not illustrated), a storage (not illustrated), and a communicator (not illustrated). The controller basically has the same structure as the controller 11. The storage basically has the same structure as the storage 12. The communicator basically has the same structure as the second communicator 14. The indoor unit 200 is an example of the air conditioner.

In each refrigerant system 1000, the transmission path 30 interconnects the outdoor unit 100 and the indoor unit 200. The transmission path 30 includes a communication line through which the outdoor unit 100 and the indoor unit 200 communicate. When the refrigerant system 1000 includes multiple indoor units 200, for example, the transmission path 30 connects the indoor units 200 in parallel with the outdoor unit 100.

The transmission path 30A in the refrigerant system 1000A and the transmission path 30B in the refrigerant system 1000B placed close to each other in parallel may have crosstalk in which a signal from one transmission path 30A propagates to another transmission path 30B. Crosstalk is more likely to occur in the RF signal used for communication with a higher frequency. Crosstalk typically results from, for example, capacitive coupling caused by stray capacitance, inductive coupling caused by mutual inductance, or radio wave radiation. Crosstalk in the process of identifying the network configuration may cause misidentification of the network configuration.

For example, in the identification process performed in the refrigerant system 1000A, the outdoor unit 100A determines that the indoor unit 200A is included in the refrigerant system 1000A. More specifically, the outdoor unit 100A broadcasts an identification signal through the transmission path 30A. Upon receiving the identification signal, the indoor unit 200A transmits a response signal including the address of the indoor unit 200A to the outdoor unit 100A through the transmission path 30A. The outdoor unit 100A determines that the indoor unit 200A that has transmitted the response signal is included in the refrigerant system 1000A.

In an example, crosstalk may cause the identification signal to be transmitted to the indoor unit 200B through the transmission path 30A and the transmission path 30B. In this case, the indoor unit 200B outputs a response signal including the address of the indoor unit 200B to the transmission path 30B. Crosstalk may then further cause the response signal to be transmitted to the outdoor unit 100A through the transmission path 30B and the transmission path 30A. In this case, the outdoor unit 100A erroneously determines that the indoor unit 200B that has transmitted the response signal is included in the refrigerant system 1000A.

Figure 3:
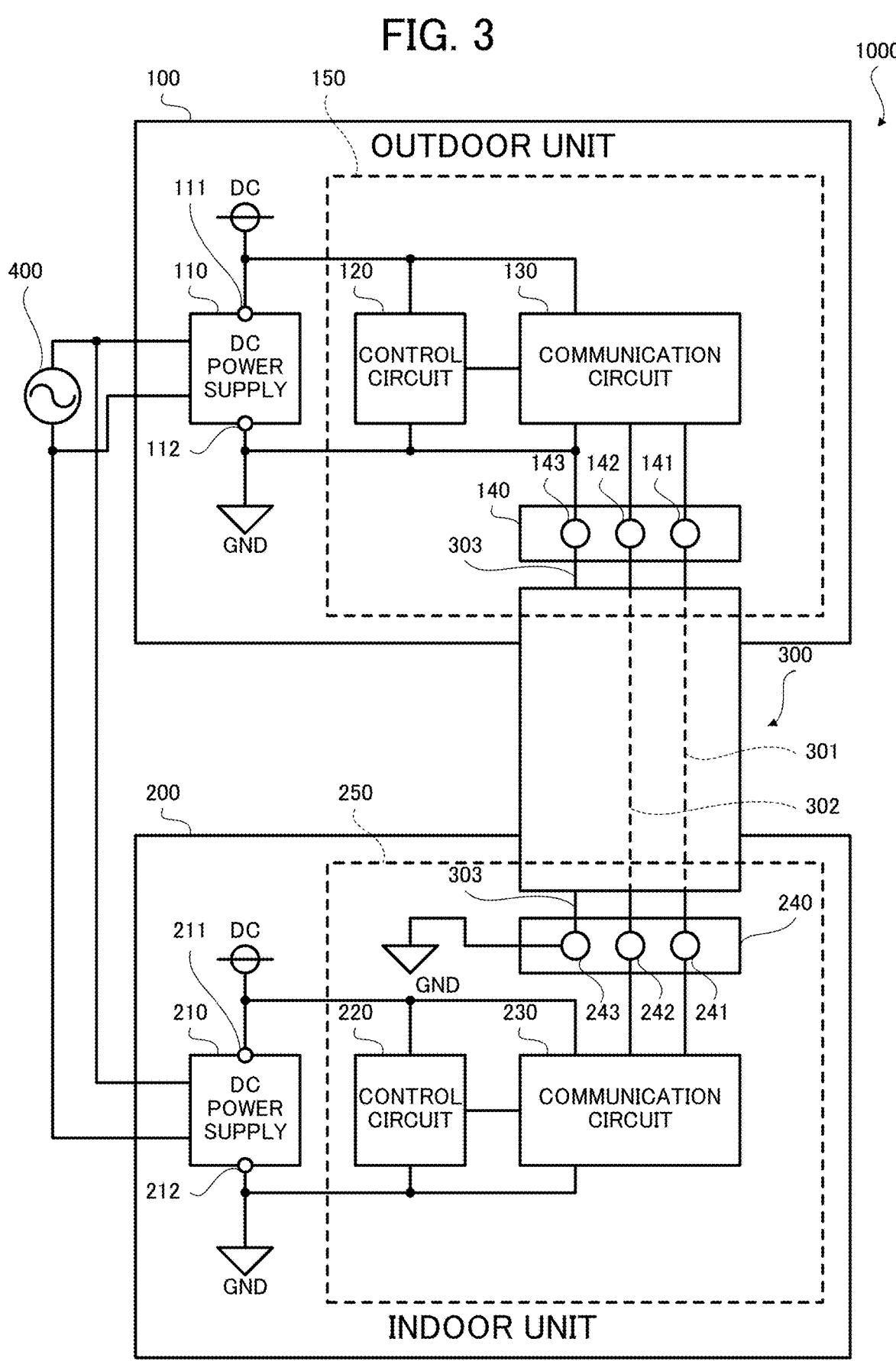
FIG. 3 is a diagram of a refrigerant system in Embodiment 1, illustrating connections between devices included in the refrigerant system.

Thus, in the present embodiment, a cable including a shield is used as the transmission path 30 to reduce crosstalk. The connections between devices in the refrigerant system 1000 are described below with reference to FIG. 3.

The outdoor unit 100 includes a direct current (DC) power supply 110, a control circuit 120, a communication circuit 130, a terminal block 140, and a metal housing 150. The indoor unit 200 includes a DC power supply 210, a control circuit 220, a communication circuit 230, a terminal block 240, and a metal housing 250. The outdoor unit 100 and the indoor unit 200 are interconnected with a cable 300. The outdoor unit 100 and the indoor unit 200 receive power from an external power supply 400. In the present embodiment, the external power supply 400 is utility power that supplies single-phase alternating current (AC) power of 200 V. The external power supply 400 is an example of an external power supply.

The DC power supply 110 generates, from the power supplied from the external power supply 400, a DC voltage being a power supply voltage. This power supply voltage is used to drive the control circuit 120 and the communication circuit 130. This power supply voltage is indicated as DC in FIG. 3. The DC power supply 110 applies the generated power supply voltage across a power terminal 111 and a ground terminal 112. The power terminal 111 is a terminal to which the power supply voltage generated by the DC power supply 110 is applied. The ground terminal 112 is a terminal set to a ground potential being a reference potential for circuit operation.

The DC power supply 110 converts AC power supplied from the external power supply 400 to DC power and outputs the power supply voltage. The DC power supply 110 includes an AC-DC converter (not illustrated) to convert AC power to DC power. The AC-DC converter (not illustrated) includes, for example, a diode bridge rectifier (not illustrated), an input capacitor (not illustrated), a switching element (not illustrated), a control circuit (not illustrated), a fast recovery diode (not illustrated), and an output capacitor (not illustrated). The DC power supply 110 is an example of a DC power supply.

The control circuit 120 controls the communication circuit 130 to perform various processes for communication. For example, the control circuit 120 generates a communication command to be transmitted from the communication circuit 130 to the indoor unit 200 and provides the generated communication command to the communication circuit 130. The control circuit 120 also acquires a communication command received by the communication circuit 130 from the indoor unit 200 and analyzes the received communication command. The control circuit 120 operates on the power supply voltage generated by the DC power supply 110. In other words, the control circuit 120 is connected to the power terminal 111 and the ground terminal 112 and operates on the power supply voltage applied across the power terminal 111 and the ground terminal 112. The control circuit 120 includes, for example, a CPU (not illustrated), a ROM (not illustrated), and a RAM (not illustrated). The control circuit 120 corresponds to the controller 11.

The communication circuit 130 communicates with the indoor unit 200 as controlled by the control circuit 120. For example, the communication circuit 130 transmits the communication command generated by the control circuit 120 to the indoor unit 200 through the cable 300. For example, the communication circuit 130 modulates the carrier wave with a baseband signal corresponding to the communication command to be transmitted, and applies the RF signal resulting from the modulation between two core wires in the cable 300. The RF signal is a differential signal applied between the two core wires. The carrier wave and the RF signal may each have a frequency greater than or equal to 1 MHz. In the present embodiment, the carrier wave and the RF signal each have a frequency of several to several tens of megahertz.

The communication circuit 130 receives the communication command from the indoor unit 200 through the cable 300 and provides the received communication command to the control circuit 120. For example, the communication circuit 130 demodulates the RF signal applied between the two core wires in the cable 300 and acquires the baseband signal corresponding to the received communication command.

The communication circuit 130 operates on the power supply voltage generated by the DC power supply 110. In other words, the communication circuit 130 is connected to the power terminal 111 and the ground terminal 112 and operates on the power supply voltage applied across the power terminal 111 and the ground terminal 112. The communication circuit 130 includes, for example, a communication driver integrated circuit (IC) and a communication interface such as a pulse transformer. The communication circuit 130 corresponds to the second communicator 14. The communication circuit 130 is an example of a communication circuit.

The terminal block 140 connects the cable 300 serving as the transmission path 30 to the outdoor unit 100. The terminal block 140 includes a terminal 141, a terminal 142, and a terminal 143. The structure and connections of the cable 300 are described below with reference to FIG. 4.

The cable 300 is used for, for example, power supply and communication. The cable 300 is a two-core cable including a shield, and includes a core wire 301, a core wire 302, a shield 303, an insulator 311, an insulator 312, and an insulator 313. The core wire 301 and the core wire 302 each transmit, for example, electric power or electrical signals and are each formed from, for example, copper or aluminum.

The shield 303 covers and shields the core wire 301 and the core wire 302. In other words, the shield 303 prevents noise radiated from an external space from entering the core wire 301 and the core wire 302. The shield 303 also prevents noise from being radiated from the core wire 301 and the core wire 302 to the external space. The shield 303 is formed from, for example, copper or aluminum. The insulator 311 covers the core wire 301. The insulator 312 covers the core wire 302. The insulator 313 covers the shield 303. The insulator 311, the insulator 312, and the insulator 313 are each formed from, for example, a vinyl chloride resin. The core wire 301 has one end connected to the terminal 141. The terminal 141 is connected to the communication circuit 130. Thus, the core wire 301 has the end connected to the communication circuit 130. The core wire 302 has one end connected to the terminal 142. The terminal 142 is connected to the communication circuit 130. Thus, the core wire 302 has the end connected to the communication circuit 130. The shield 303 has one end connected to the terminal 143. The terminal 143 is connected to the ground terminal 112.

The core wire 301 has the other end connected to a terminal 241. The terminal 241 is connected to the communication circuit 230. Thus, the core wire 301 has the other end connected to the communication circuit 230. The core wire 302 has the other end connected to a terminal 242. The terminal 242 is connected to the communication circuit 230. Thus, the core wire 302 has the other end connected to the communication circuit 230. The shield 303 has the other end connected to a terminal 243. The terminal 243 is connected to the ground terminal 212.

Thus, the cable 300 includes a shield, the core wire 301 and the core wire 302 used for communication between the outdoor unit 100 and the indoor unit 200, and the shield 303 for shielding the core wire 301 and the core wire 302. The cable 300 is a cable such as a vinyl-insulated vinyl-sheathed shield cable for microphones (MVVS) or a vinyl-insulated vinyl-sheathed shield cable for control use (CVVS). When the refrigerant system 1000 includes multiple indoor units 200, the cable 300 interconnects the terminal blocks 240 in the multiple indoor units 200.

Figure 4:
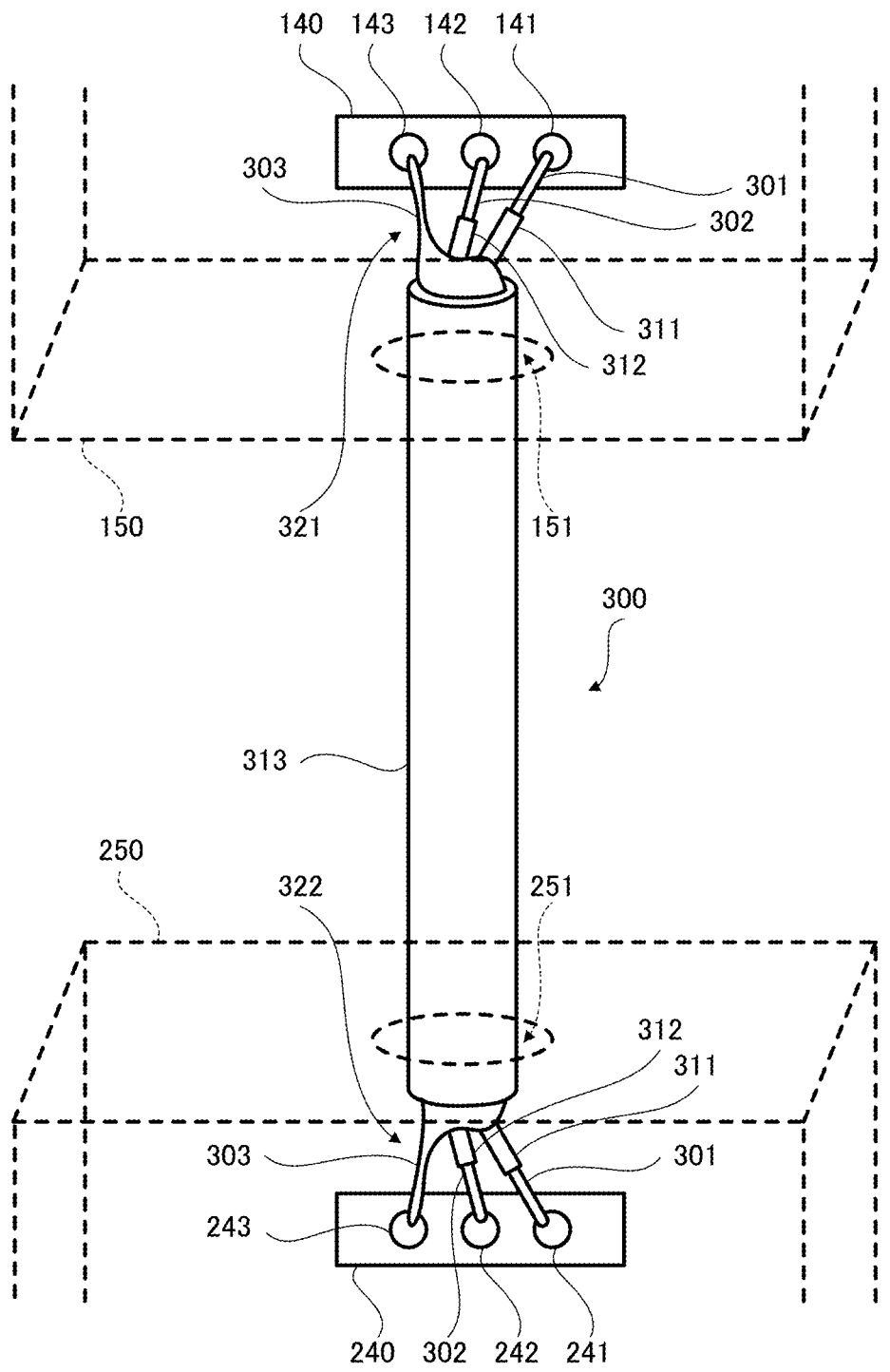
FIG. 4 is a diagram of a cable, illustrating the connections.

The metal housing 150 is formed from metal. The metal housing 150 shields, from outside, the circuits accommodated inside. The metal housing 150 accommodates the control circuit 120, the communication circuit 130, and the terminal block 140. As illustrated in FIG. 4, the metal housing 150 also accommodates an uncovered portion 321 at one end of the cable 300. The uncovered portion 321 is a portion at the end of the cable 300 including the core wire 301 and core wire 302 uncovered with the shield 303.

The metal housing 150 has openings each with a length sufficiently shorter than the wavelength of the RF signal used for communication. In other words, the metal housing 150 has no opening longer than a length threshold corresponding to the wavelength of the RF signal used for communication. The length threshold may be, for example, less than or equal to 1/100 of the wavelength of the RF signal. The metal housing 150 has various openings for passing wires to connect the inside and the outside of the metal housing 150. For each of these openings, the longest portion has a length less than or equal to the above length threshold.

For example, the metal housing 150 has an opening 151 for passing the cable 300. The longest portion of the opening 151 has a length less than or equal to the above length threshold. As described above, the metal housing 150 simply has, as the opening, the opening 151 that is sufficiently shorter than the wavelength of the RF signal. Thus, radio waves radiated from the terminal block 140 and the uncovered portion 321 upon transmission of the RF signal are blocked by the metal housing 150. This reduces crosstalk resulting from the radio wave radiation.

The DC power supply 210 generates, from the power supplied from the external power supply 400, the power supply voltage being a DC voltage. This power supply voltage is used to drive the control circuit 220 and the communication circuit 230. The DC power supply 210 applies the generated power supply voltage across a power terminal 211 and a ground terminal 212. The power terminal 211 is a terminal to which the power supply voltage generated by the DC power supply 210 is applied. The ground terminal 212 is a terminal set to the ground potential as a reference potential for circuit operation. The DC power supply 210 basically has the same structure as the DC power supply 110. The DC power supply 210 is an example of the DC power supply.

The control circuit 220 controls the communication circuit 230 to perform various processes for communication. For example, the control circuit 220 generates a communication command to be transmitted from the communication circuit 230 to the outdoor unit 100 and provides the generated communication command to the communication circuit 230. The control circuit 220 also acquires a communication command received by the communication circuit 230 from the outdoor unit 100 and analyzes the received communication command. The control circuit 220 operates on the power supply voltage generated by the DC power supply 210. In other words, the control circuit 220 is connected to the power terminal 211 and the ground terminal 212, and operates on the power supply voltage applied across the power terminal 211 and the ground terminal 212. The control circuit 220 basically has the same structure as the control circuit 120.

The communication circuit 230 communicates with the outdoor unit 100 as controlled by the control circuit 220. For example, the communication circuit 230 transmits the communication command generated by the control circuit 220 to the outdoor unit 100 through the cable 300. For example, the communication circuit 230 modulates the carrier wave with a baseband signal corresponding to the communication command to be transmitted, and applies the RF signal resulting from the modulation between two core wires in the cable 300.

The communication circuit 230 receives the communication command from the outdoor unit 100 through the cable 300 and provides the received communication command to the control circuit 220. For example, the communication circuit 230 demodulates the RF signal applied between the two core wires in the cable 300 and acquires the baseband signal corresponding to the received communication command.

The communication circuit 230 operates on the power supply voltage generated by the DC power supply 210. In other words, the communication circuit 230 is connected to the power terminal 211 and the ground terminal 212, and operates on the power supply voltage applied across the power terminal 211 and the ground terminal 212. The communication circuit 230 basically has the same structure as the communication circuit 130. The communication circuit 230 is an example of the communication circuit.

The terminal block 240 connects the cable 300 serving as the transmission path 30 to the indoor unit 200. The terminal block 240 includes the terminal 241, the terminal 242, and the terminal 243. As described above, the other end of the core wire 301 is connected to the communication circuit 230 through the terminal 241. The other end of the core wire 302 is connected to the communication circuit 230 through the terminal 242. The other end of the shield 303 is connected to the ground terminal 212 through the terminal 243.

The metal housing 250 is formed from metal. The metal housing 250 shields the circuits accommodated inside from the outside. The metal housing 250 accommodates the control circuit 220, the communication circuit 230, and the terminal block 240. As illustrated in FIG. 4, the metal housing 250 also accommodates an uncovered portion 322 at the other end of the cable 300. The uncovered portion 322 is a portion at the other end of the cable 300 in which the core wire 301 and core wire 302 are not covered with the shield 303.

The metal housing 250 has no opening longer than the length threshold. The metal housing 250 has various openings for passing wires to connect the inside and the outside of the metal housing 250. For each of these openings, the longest portion has a length less than or equal to the above length threshold. For example, the metal housing 250 has an opening 251 for passing the cable 300. The longest portion of the opening 251 has a length less than or equal to the above length threshold.

As described above, the metal housing 250 simply has, as the opening, the opening 251 that is sufficiently shorter than the wavelength of the RF signal. Thus, radio waves radiated from the terminal block 240 and the uncovered portion 322 upon transmission of the RF signal are blocked by the metal housing 250. This reduces crosstalk resulting from the radio wave radiation.

Crosstalk is reduced as described below. Crosstalk results from, for example, capacitive coupling caused by electrostatic induction based on stray capacitance, inductive coupling caused by electromagnetic induction based on mutual inductance, or radio wave radiation. The stray capacitance refers to stray capacitance between the core wire 301 and another core wire or between the core wire 302 and another core wire. The mutual inductance refers to mutual inductance between the core wire 301 and another core wire or between the core wire 302 and another core wire. Another core wire refers to a core wire included in the transmission path 30 in another refrigerant system 1000.

When the core wire 301 and the core wire 302 are not covered with the shield 303, electrostatic induction based on stray capacitance may cause, during transmission of the RF signal, capacitive coupling between the core wire 301 and another core wire or between the core wire 302 and another core wire. This may cause the RF signal to be transmitted from the core wire 301 or the core wire 302 to the other core wire. Additionally, electromagnetic induction based on mutual inductance may cause inductive coupling between the core wire 301 and another core wire or between the core wire 302 and another core wire. This may also cause the RF signal to be transmitted from the core wire 301 or the core wire 302 to the other core wire. Radio wave radiation may also cause the RF signal to be transmitted from the core wire 301 or the core wire 302 to the other core wire.

In the present embodiment, the core wire 301 and the core wire 302 are covered with the shield 303, and the shield 303 is connected to the ground. Thus, the shield 303 that functions as an electrostatic shield blocks the electric field during the transmission of the RF signal, reducing the transmission of the RF signal caused by capacitive coupling. The shield 303 that also functions as an electromagnetic shield blocks the magnetic field during the transmission of RF signal, reducing the transmission of the RF signal caused by inductive coupling. The shield 303 that functions as an electromagnetic shield also blocks radio waves during the transmission of the RF signal, reducing the transmission of the RF signal caused by radio wave radiation.

Figure 5:
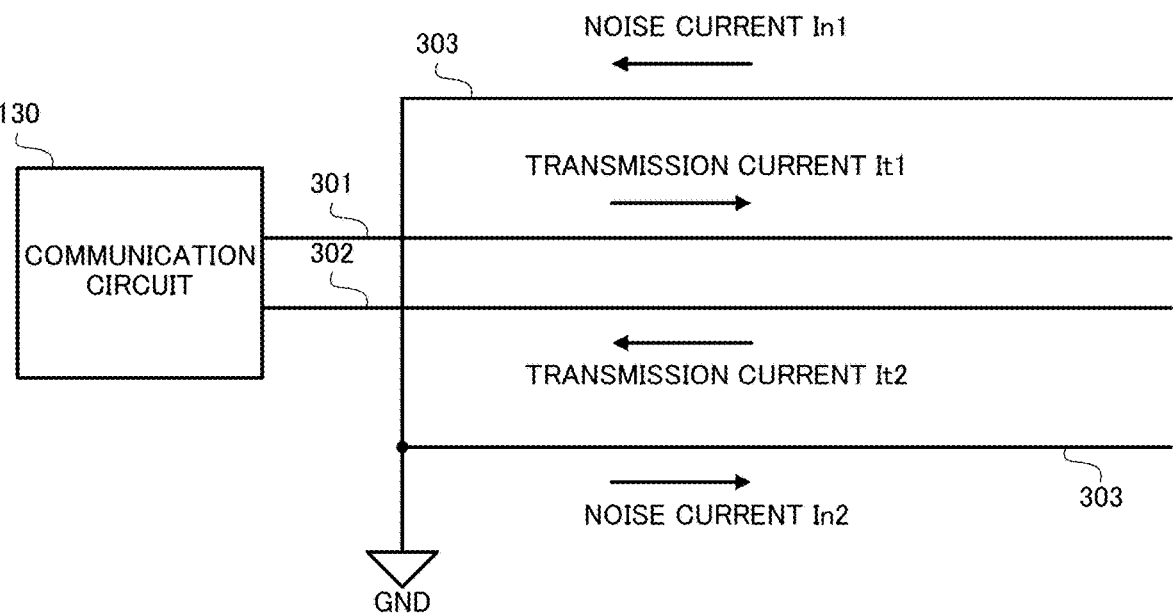
FIG. 5 is a diagram describing crosstalk reduction.

The reduction of transmission of the RF signal due to inductive coupling when the communication circuit 130 in the outdoor unit 100 transmits the RF signal to the communication circuit 230 in the indoor unit 200 is described below with reference to FIG. 5.

When the communication circuit 130 transmits the RF signal to the communication circuit 230, a transmission current It1 flows in the core wire 301 from the communication circuit 130 to the communication circuit 230. With the transmission current It1 flowing in the core wire 301, a noise current In1 is generated in a portion of the shield 303 facing the core wire 301. The noise current In1 flows to the ground of the communication circuit 130 connected to one end of the shield 303.

The transmission current It1 flows in the core wire 301 in a direction opposite to the direction in which the noise current In1 flows in the shield 303. Thus, the magnetic field generated by the transmission current It1 and the magnetic field generated by the noise current In1 cancel each other. This reduces crosstalk resulting from inductive coupling between the transmission paths 30. For example, when the outdoor unit 100A transmits the RF signal to the indoor unit 200A through the transmission path 30A, no strong magnetic field is generated in a space outside the transmission path 30A. Thus, no inductive coupling occurs between the transmission path 30A and the transmission path 30B, and no RF signal propagates from the transmission path 30A to the transmission path 30B.

When the communication circuit 130 transmits the RF signal to the communication circuit 230, a transmission current It2 flows in the core wire 302 from the communication circuit 230 to the communication circuit 130, in addition to the transmission current It1 flowing in the core wire 301 from the communication circuit 130 to the communication circuit 230. The same as described above for the transmission current It1 applies to the transmission current It2. In other words, with the transmission current It2 flowing in the core wire 302, a noise current In2 is generated in a portion of the shield 303 facing the core wire 302. The noise current In2 flows to the ground of the communication circuit 130 connected to one end of the shield 303.

The transmission current It2 flows in the core wire 302 in a direction opposite to the direction in which the noise current In2 flows in the shield 303. Thus, the magnetic field generated by the transmission current It2 and the magnetic field generated by the noise current In2 cancel each other. This reduces crosstalk resulting from inductive coupling between the transmission paths 30.

In the above example, the communication circuit 130 transmits the RF signal to the communication circuit 230. The same as described above applies to an example in which the communication circuit 230 transmits the RF signal to the communication circuit 130. More specifically, a noise current generated by a transmission current flowing from the communication circuit 230 to the communication circuit 130 flows to the ground of the communication circuit 230, reducing crosstalk resulting from inductive coupling between the transmission paths 30.

In the present embodiment, the core wire 301 and the core wire 302 in the cable 300 including the shield 303 serve as the communication lines interconnecting the multiple air conditioners, and the shield 303 is connected to the grounds at the two ends of the cable 300. This reduces electrostatic coupling and inductive coupling between the transmission paths 30, reducing crosstalk to air conditioners not connected to the cable 300. Thus, the structure according to the present embodiment can reduce crosstalk in communication between air conditioners using RF signals.

In the present embodiment, the metal housing 150 having no opening longer than the length threshold accommodates the terminal block 140 and the uncovered portion 321 of the cable 300, and the metal housing 250 having no opening longer than the length threshold accommodates the terminal block 240 and the uncovered portion 322 of the cable 300. The structure according to the present embodiment can reduce crosstalk resulting from radio wave radiation from the terminal block 140, the terminal block 240, the uncovered portion 321, and the uncovered portion 322.

Embodiment 2

In Embodiment 1, one end of the shield 303 is directly connected to the ground of the communication circuit 130, and the other end of the shield 303 is directly connected to the ground of the communication circuit 230. In the present embodiment, one end of the shield 303 is indirectly connected to the ground of the communication circuit 130, and the other end of the shield 303 is indirectly connected to the ground of the communication circuit 230. The same components and functions as in Embodiment 1 are not described or are described briefly.

Figure 6:
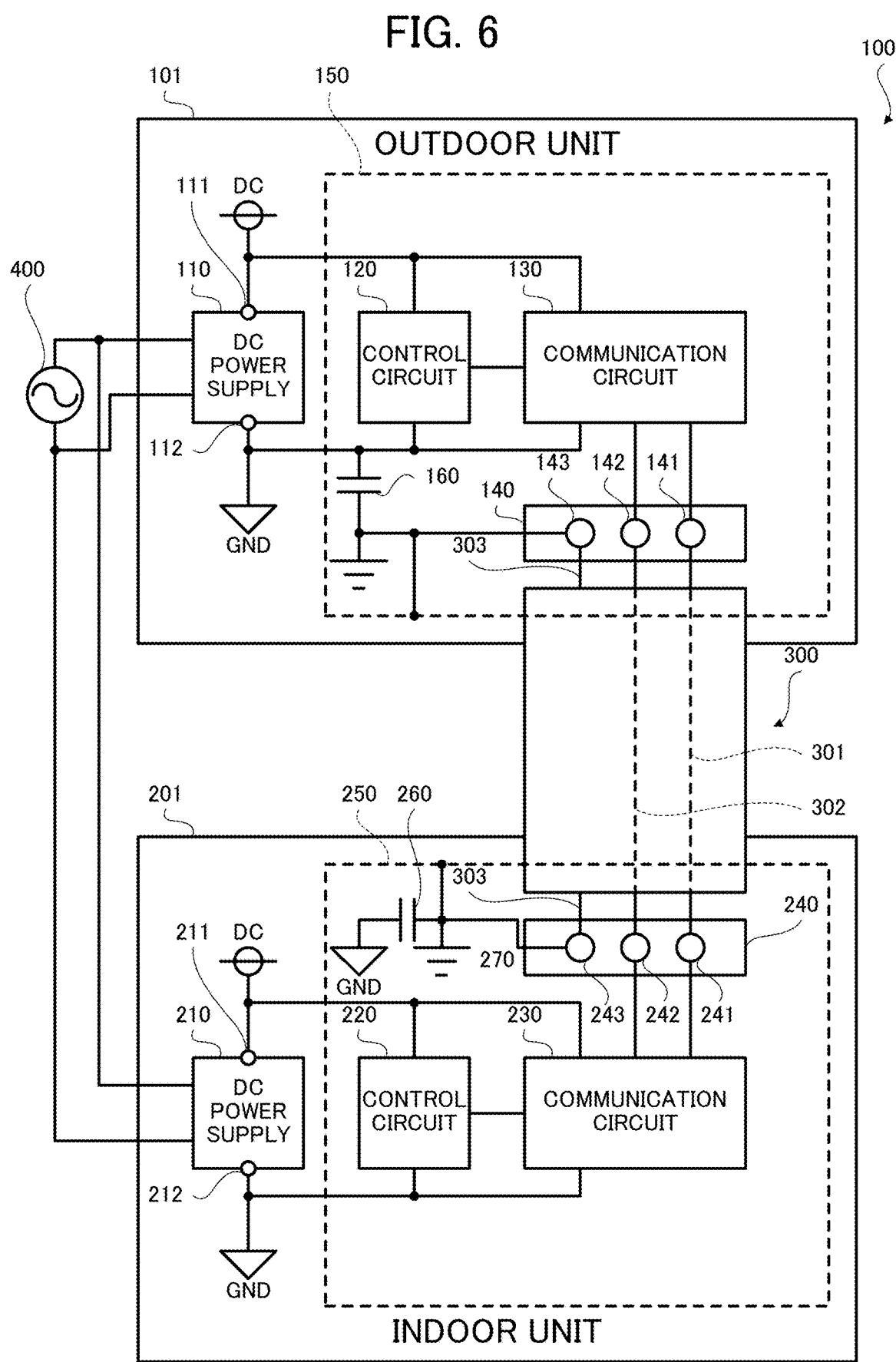
FIG. 6 is a diagram of a refrigerant system in Embodiment 2, illustrating connections between devices included in the refrigerant system.

As illustrated in FIG. 6, a refrigerant system 1001 according to the present embodiment includes an outdoor unit 101, an indoor unit 201, and the cable 300 serving as the transmission path 30. The outdoor unit 101 includes the DC power supply 110, the control circuit 120, the communication circuit 130, the terminal block 140, the metal housing 150, and a capacitor 160. The indoor unit 201 includes the DC power supply 210, the control circuit 220, the communication circuit 230, the terminal block 240, the metal housing 250, and a capacitor 260.

In the present embodiment as well, the control circuit 120 and the communication circuit 130 are connected to the power terminal 111 and the ground terminal 112, and operate on the power supply voltage applied across the power terminal 111 and the ground terminal 112. The control circuit 220 and the communication circuit 230 are connected to the power terminal 211 and the ground terminal 212, and operate on the power supply voltage applied across the power terminal 211 and the ground terminal 212.

In the present embodiment, the shield 303 is earthed at two ends of the cable 300. More specifically, one end of the shield 303 is connected to the terminal 143 earthed through the metal housing 150 to be earthed. The other end of the shield 303 is connected to the terminal 243 earthed through the metal housing 250 to be earthed. When the metal housing 150 and the metal housing 250 are larger, the metal housing 150 and the metal housing 250 may not be earthed, and may each serve as earth.

In the present embodiment, at each of the two ends of the cable 300, the impedance between the ground and the earth at a frequency of the RF signal is less than or equal to a predetermined impedance threshold. The impedance threshold is a value that does not attenuate a signal or noise greatly. In other words, in the present embodiment, a signal or noise of the above frequency can pass between the ground and the earth without substantial attenuation.

In the present embodiment, at each of the two ends of the cable 300, the ground is earthed through a capacitor with a capacitance greater than or equal to a capacitance threshold to connect the ground and the earth at the above frequency with a low impedance. More specifically, at one end of the cable 300, the ground of the communication circuit 130 is earthed through the capacitor 160 with a capacitance greater than or equal to the capacitance threshold. At the other end of the cable 300, the ground of the communication circuit 230 is earthed through the capacitor 260 with a capacitance greater than or equal to the capacitance threshold. The capacitance threshold is a threshold value corresponds to the frequency of the RF signal described above. The capacitance threshold is larger when the frequency of the RF signal described above is lower. The capacitance threshold is, for example, 1000 pF.

In the present embodiment, the impedance between one end of the shield 303 and the ground of the communication circuit 130 at the above frequency is low. Thus, a noise current generated by a transmission current flowing from the communication circuit 130 to the communication circuit 230 flows to the ground of the communication circuit 130, reducing crosstalk resulting from capacitive coupling, inductive coupling, or radio wave radiation.

The impedance between the other end of the shield 303 and the ground of the communication circuit 230 at the above frequency is also low. Thus, a noise current generated by a transmission current flowing from the communication circuit 230 to the communication circuit 130 flows to the ground of the communication circuit 230, reducing crosstalk resulting from capacitive coupling, inductive coupling, or radio wave radiation.

In the present embodiment, the ground of the communication circuit 130 and the earth are connected through the capacitor 160, and the ground of the communication circuit 230 and the earth are connected through the capacitor 260. The capacitor 160 and the capacitor 260 each function as a Y-capacitor. In other words, the capacitor 160 causes common-mode noise generated in the cable 300 to flow to the ground to prevent the common-mode noise from flowing to the communication circuit 130. The capacitor 260 causes common-mode noise generated in the cable 300 to flow to the ground to prevent the common-mode noise from flowing to the communication circuit 230.

In the present embodiment, as described above, the shield 303 is earthed at the two ends of the cable 300, and at each of the two ends of the cable 300, the impedance between the ground and the earth at the frequency of the RF signal is less than or equal to the predetermined impedance threshold. Thus, the structure according to the present embodiment can reduce crosstalk while reducing common-mode noise.

Embodiment 3

In Embodiment 1, noise flowing to other devices through the external power supply 400 is not described. In the present embodiment, a technique for reducing noise flowing to other devices through the external power supply 400 is described. The noise refers to noise associated with communication using RF signals, such as noise generated in the transmission path 30. The noise corresponds to, for example, the noise current In1 or the noise current In2 flowing in the shield 303. The same components and functions as in Embodiments 1 and 2 are not described or are described briefly.

Figure 7:
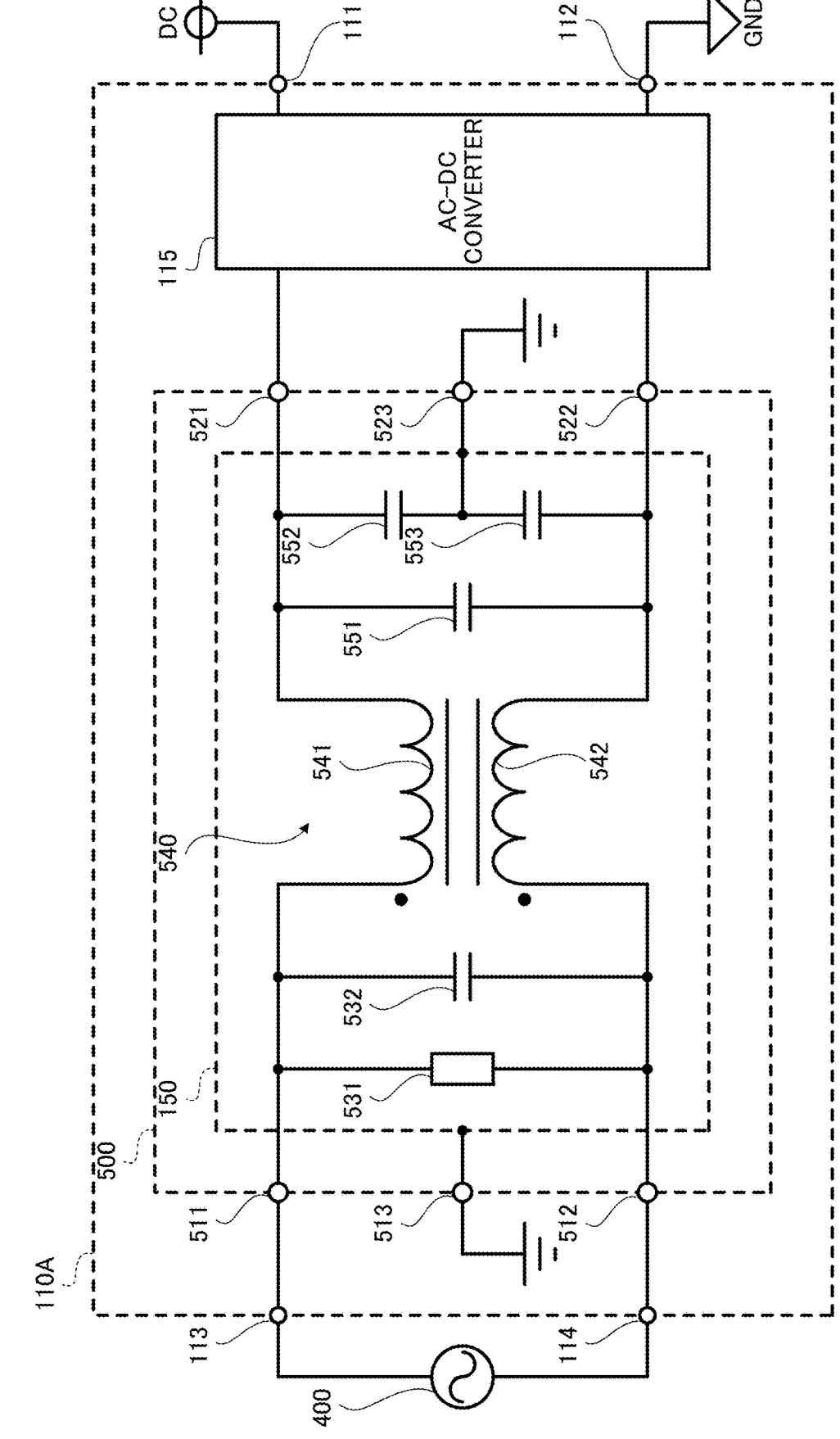
FIG. 7 is a schematic diagram of a direct current (DC) power supply in Embodiment 3.

As illustrated in FIG. 7, a DC power supply 110A in the present embodiment includes the power terminal 111, the ground terminal 112, a terminal 113, a terminal 114, an AC-DC converter 115, and a filter circuit 500.

The power terminal 111 is a terminal to which the power supply voltage output from the DC power supply 110A is applied. The ground terminal 112 is a terminal to which the ground potential of the DC power supply 110A is applied. The terminal 113 is connected to one end of the external power supply 400. The terminal 114 is connected to the other end of the external power supply 400. The AC-DC converter 115 converts AC power supplied from the external power supply 400 through the filter circuit 500 to DC power.

The filter circuit 500 removes RF waves and is located between the external power supply 400 and output portions of the DC power supply 110A. The output portions of the DC power supply 110A correspond to the power terminal 111 and the ground terminal 112. The filter circuit 500 reduces the propagation of RF components from the external power supply 400 to the AC-DC converter 115, and reduces the propagation of RF components from the AC-DC converter 115 to the external power supply 400. Thus, the filter circuit 500 attenuates noise flowing from the transmission path 30 to the external power supply 400 through the AC-DC converter 115. The filter circuit 500 is an example of a filter circuit.

The filter circuit 500 includes a terminal 511, a terminal 512, a terminal 513, a terminal 521, a terminal 522, a terminal 523, a resistor 531, a capacitor 532, a common-mode coil 540, a capacitor 551, a capacitor 552, and a capacitor 553. The terminal 511 and the terminal 512 are input terminals. The terminal 521 and the terminal 522 are output terminals. The terminal 513 and the terminal 523 are earthed through the metal housing 150.

The resistor 531 is a discharge resistor connected between lines. The capacitor 532 and the capacitor 551 are each connected between lines mainly to attenuate normal-mode noise. The capacitor 552 and the capacitor 553 are each connected between a line and earth to attenuate common-mode noise.

The common-mode coil 540 includes a core of a magnetic material with copper wires wound around the core in the same phase. This causes the magnetic fluxes of currents flowing in two coils to cancel each other and generates a large inductance while preventing core saturation. The common-mode coil 540 includes a coil 541 located on one line and a coil 542 located on another line.

In the present embodiment, noise generated during communication using RF signals attenuates when passing through the filter circuit 500. Thus, in the present embodiment, noise flowing to other devices through the external power supply 400 is reduced. The other devices refer to devices connected to the external power supply 400 other than a target device including the DC power supply 110A. For example, when the target device is the outdoor unit 100A, other devices include, for example, the outdoor unit 100B, the indoor unit 200A, and the indoor unit 200B.

Embodiment 4

In Embodiment 3, the filter circuit 500 is located closer to the external power supply 400 than the AC-DC converter 115. In the present embodiment, the AC-DC converter 115 is located closer to the external power supply 400 than the filter circuit 500. The same components and functions as in Embodiments 1 to 3 are not described or are described briefly.

Figure 8:
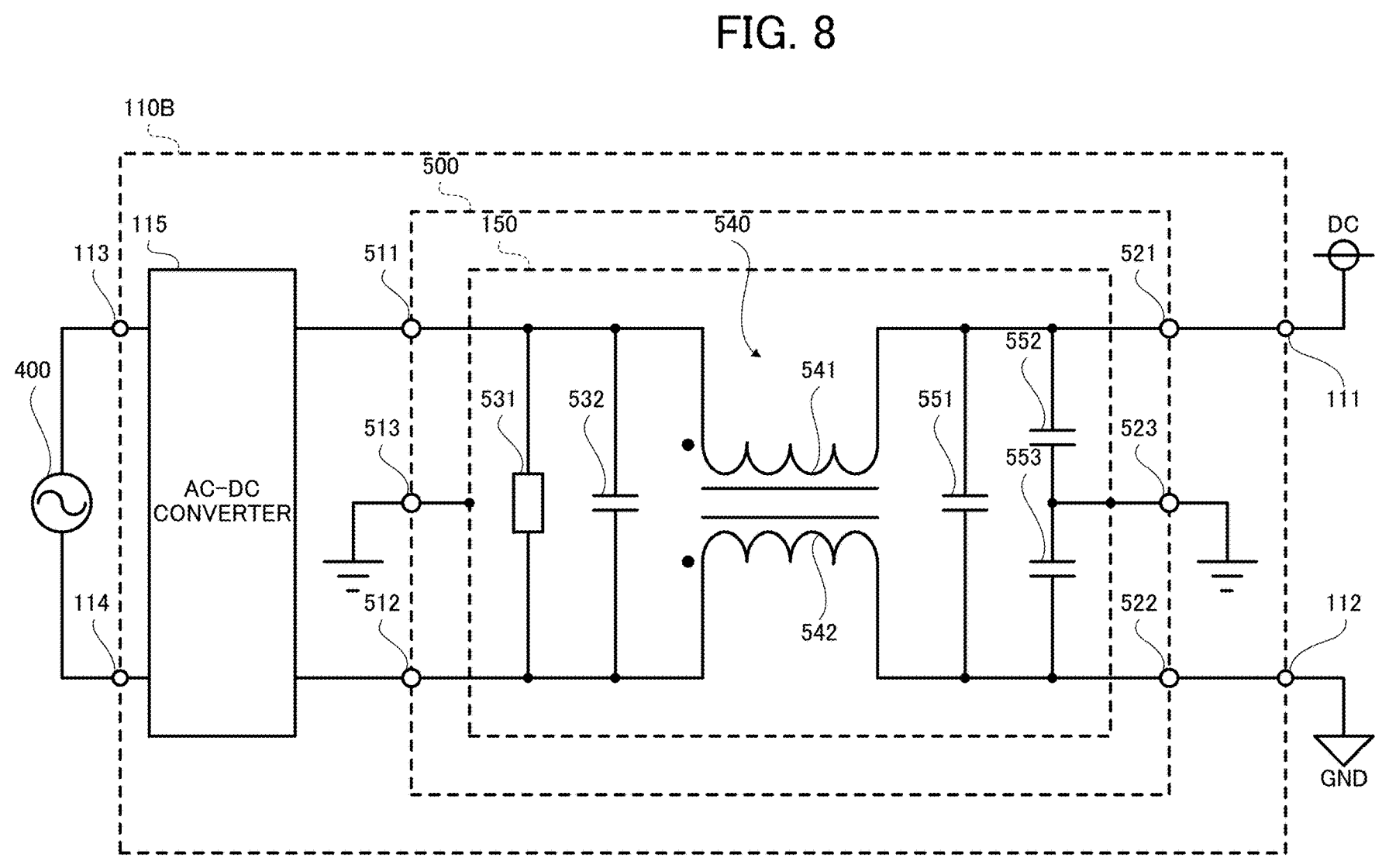

As illustrated in FIG. 8, the DC power supply 110B in the present embodiment includes the power terminal 111, the ground terminal 112, the terminal 113, the terminal 114, the AC-DC converter 115, and the filter circuit 500. In the DC power supply 110B, the AC-DC converter 115 is located closer to the external power supply 400 than the filter circuit 500.

In other words, the AC-DC converter 115 is connected to the terminal 113, the terminal 114, the terminal 511, and the terminal 512, converts AC power supplied through the terminal 113 and the terminal 114 to DC power, and supplies the resultant DC power to the filter circuit 500 through the terminal 511 and the terminal 512. The terminal 521 in the filter circuit 500 and the power terminal 111 are connected to each other. The terminal 522 in the filter circuit 500 and the ground terminal 112 are connected to each other. The filter circuit 500 attenuates noise flowing from the transmission path 30 to the external power supply 400 through the AC-DC converter 115.

In the present embodiment, noise generated during communication using RF signals attenuates when passing through the filter circuit 500. Thus, in the present embodiment, noise flowing to other devices through the external power supply 400 is reduced.

Modifications

The embodiments of the present disclosure described above may be modified or applied in various forms to implement the present disclosure. In the present disclosure, the components, functions, and operations described in the above embodiments may be selectively used as appropriate. In the present disclosure, further components, functions, and operations may also be used other than the components, functions, and operations described above. The components, functions, and operations described in the above embodiments may be combined as appropriate.

In Embodiment 1, crosstalk is reduced by connecting the shield 303 in the cable 300 to the ground in each of the outdoor unit 100 and the indoor unit 200. In a refrigerant system 1000 including multiple indoor units 200, crosstalk can be reduced by connecting the shield 303 in the cable 300 to the ground in each of the multiple indoor units 200.

In Embodiment 1, the transmission path 30 is used simply for communication. The transmission path 30 may be used for feeding power in addition to communication. For example, the outdoor unit 100 may supply the power supply voltage generated by the DC power supply 110 to the indoor unit 200 through the core wire 301 and the core wire 302 in the cable 300. The indoor unit 200 may supply the power supply voltage generated by the DC power supply 210 to the outdoor unit 100 through the core wire 301 and the core wire 302.

In Embodiment 1, the outdoor unit 100 and the indoor unit 200 communicate with each other using RF signals for a multicarrier transmission method. The outdoor unit 100 and the indoor unit 200 may communicate with each other using RF signals for a transmission method other than a multicarrier transmission method.

In Embodiment 1, a foil shield is used as the shield 303 in the cable 300. A mesh shield may be used as the shield 303 in the cable 300. In this case, the mesh may have a pitch sufficiently shorter than the wavelength of the RF signal. For example, the pitch of the mesh may be less than or equal to the length threshold described above and may be, for example, 1/100 of the wavelength of the RF signal. This reduces leakage of electric fields, magnetic fields, or radio waves through gaps in the shield 303, reducing crosstalk resulting from capacitive coupling, inductive coupling, or radio wave radiation.

In Embodiments 3 and 4, the filter circuit 500 is located inside the DC power supply 110A or the DC power supply 110B. The filter circuit 500 may be located outside the DC power supply 110A or the DC power supply 110B. In Embodiments 3 and 4, the filter circuit 500 is located near one end of the DC power supply 110A or the DC power supply 110B. The filter circuit 500 may be located near the two ends of the DC power supply 110A or the two ends of the DC power supply 110B.

The filter circuit 500 may be a circuit different from the circuit described in Embodiments 3 and 4. For example, the filter circuit 500 may include the terminal 511, the terminal 512, the terminal 513, the terminal 521, the terminal 522, the terminal 523, and the common-mode coil 540, and may not include the resistor 531, the capacitor 532, the capacitor 551, the capacitor 552, or the capacitor 553.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

INDUSTRIAL APPLICABILITY

The technique according to one or more embodiments of the present disclosure is applicable to an air conditioning system including an outdoor unit and an indoor unit.

The invention claimed is:

1. An air conditioning system, comprising:

a plurality of air conditioners; and a communication line interconnecting the plurality of air conditioners, wherein the communication line is a core wire included in a cable including a shield, each of the plurality of air conditioners includes a direct current power supply to generate a power supply voltage being a direct current voltage, a communication circuit drivable by the power supply voltage generated by the direct current power supply, a terminal block to connect the communication line to the communication circuit, and a metal housing accommodating the terminal block and a portion of the cable in which the core wire is not covered with the shield, the communication circuit communicates with another communication circuit with a communication method using a radio frequency signal through the communication line, the shield is connected to a ground of the communication circuit at each of two ends of the cable, and the metal housing has no opening longer than a length threshold corresponding to a wavelength of the radio frequency signal.

2. The air conditioning system according to claim 1, wherein the shield is earthed at the two ends of the cable, and at each of the two ends of the cable, an impedance between the ground of the communication circuit and earth at a frequency of the radio frequency signal is less than or equal to a predetermined impedance threshold.

3. The air conditioning system according to claim 2, wherein at each of the two ends of the cable, the ground of the communication circuit is earthed through a capacitor with a capacitance greater than or equal to a capacitance threshold corresponding to the frequency of the radio frequency signal.

4. The air conditioning system according to claim 1, wherein the direct current power supply generates the power supply voltage from power supplied from an external power supply, and each of the plurality of air conditioners includes a filter circuit to remove a radio frequency wave between the external power supply and an output portion of the direct current power supply.

5. The air conditioning system according to claim 1, wherein the radio frequency signal has a frequency greater than or equal to 1 MHz.

6. The air conditioning system according to claim 2, wherein the direct current power supply generates the power supply voltage from power supplied from an external power supply, and each of the plurality of air conditioners includes a filter circuit to remove a radio frequency wave between the external power supply and an output portion of the direct current power supply.

7. The air conditioning system according to claim 3, wherein the direct current power supply generates the power supply voltage from power supplied from an external power supply, and each of the plurality of air conditioners includes a filter circuit to remove a radio frequency wave between the external power supply and an output portion of the direct current power supply.

8. The air conditioning system according to claim 2, wherein the radio frequency signal has a frequency greater than or equal to 1 MHz.

9. The air conditioning system according to claim 3, wherein the radio frequency signal has a frequency greater than or equal to 1 MHz.

10. The air conditioning system according to claim 4, wherein the radio frequency signal has a frequency greater than or equal to 1 MHz.

* * * * *